United States Patent [19]

Schuster

[11] Patent Number: 4,645,954
[45] Date of Patent: Feb. 24, 1987

[54] ECL TO FET INTERFACE CIRCUIT FOR FIELD EFFECT TRANSISTOR ARRAYS

[75] Inventor: Stanley E. Schuster, Granite Springs, N.Y.

[73] Assignee: International Business Machines Corp., Armonk, N.Y.

[21] Appl. No.: 789,884

[22] Filed: Oct. 21, 1985

[51] Int. Cl.[4] ...................... H03K 19/092; H03K 5/13
[52] U.S. Cl. .................................. 307/475; 307/264; 307/269; 307/530
[58] Field of Search ............... 307/475, 530, 269, 449, 307/279, 463, 264; 365/189, 230

[56] References Cited

U.S. PATENT DOCUMENTS

| | | | |
|---|---|---|---|
| 4,396,845 | 8/1983 | Nakano | 307/475 |
| 4,417,163 | 11/1983 | Otsuki et al. | 307/475 |
| 4,508,983 | 4/1985 | Allgood et al. | 307/269 |
| 4,561,702 | 12/1985 | McAdams | 307/475 |

Primary Examiner—Stanley D. Miller
Assistant Examiner—M. R. Wambach
Attorney, Agent, or Firm—Pollock, Vande Sande & Priddy

[57] ABSTRACT

An interface circuit for coupling bipolar ECL logic circuit signals to an FET logic array. The interface receives chip select signals and their complement on a dual rail input line. A small signal amplifier comprising an FET amplifier having an input FET transistor connected through its source and gate to the dual rail input terminals, converts the chip enable signal to a high level clocking signal. An FET dynamic sense amplifier receives a bipolar ECL logic level to be converted to an FET logic level, and receives a reference level from the bipolar transistor logic circuit. Upon clocking of the dynamic sense amplifier by the small signal multiplier, the true and complementary FET logic levels corresponding to the input bipolar logic levels are provided by the dynamic sense amplifier.

4 Claims, 6 Drawing Figures

ECL/FET
INTERFACE

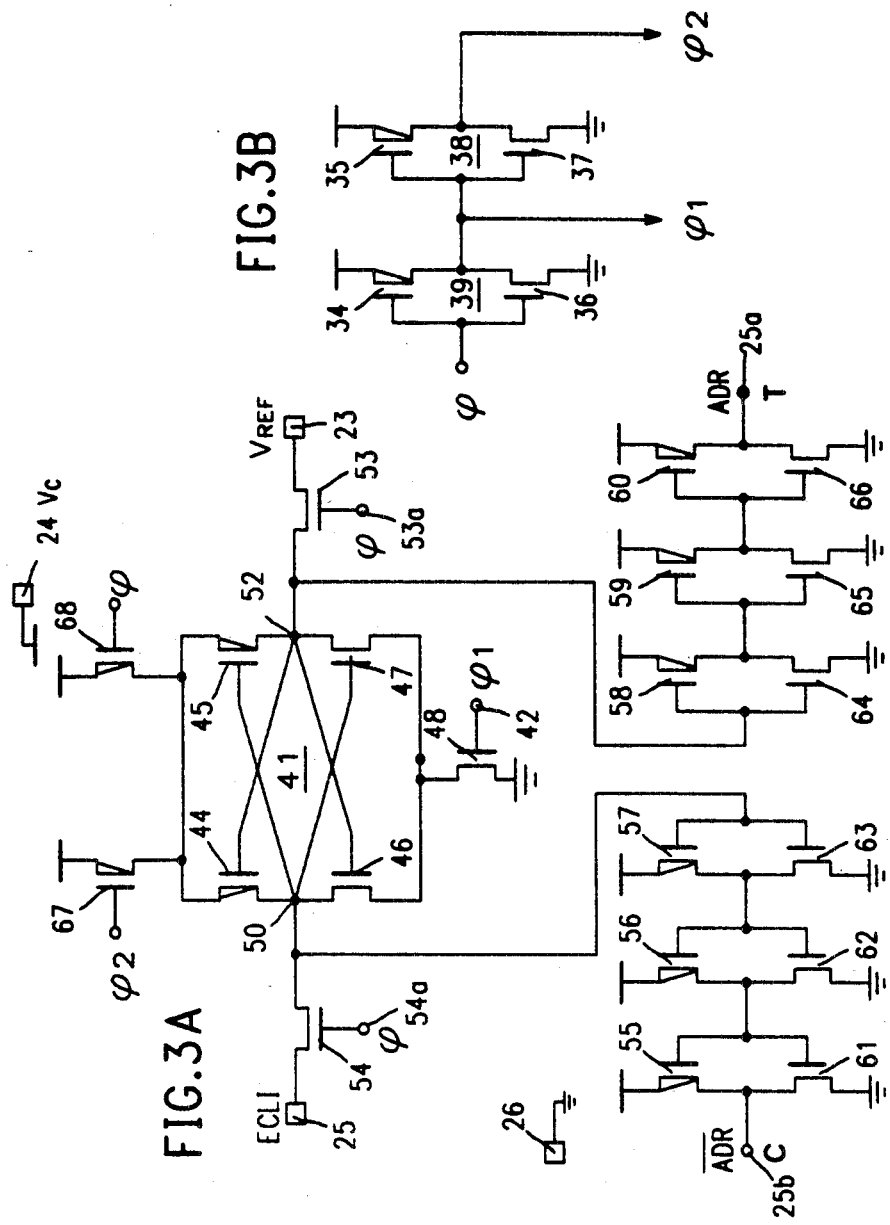

ECL TO FET INTERFACE CIRCUIT FOR FIELD EFFECT TRANSISTOR ARRAYS

The present invention relates to field effect transistor (FET) circuits for converting input ECL transistor logic levels to FET logic levels. Specifically, circuits for MOS semiconductor memories, which convert a dual rail ECL chip select signals to an FET voltage level and single rail ECL address and data-in signals to true and complement FET voltage levels will be described.

Transistor memories fabricated by MOS fabrication techniques experience delays in memory access due to the limitations of MOS technologies. Efforts have been successful in reducing delay inherent with this technology. The normal drive for FET memories is accomplished with transistor-transistor logic, TTL, which can swing from 0 to 5 volts. The large voltage swing results in large current swings di/dt on the leads driving the FET memory array. As the operational speed of reading and writing FET memory arrays has increased, these current swings have produced an external limitation on the signals used to drive the memory chips, while the actual internal access time of the memory has decreased from more than 100 ns to less than 20 ns. Increasing the speed of the input signals in an attempt to keep up with increasing memory speed results in more noise from large di/dt current changes and lead inductance which reduces the overall reliability of the memory system.

Emitter coupled logic ECL operates at much higher switching rates than TTL. Emitter coupled logic provides a nominal excursion between logic levels of ±0.5 volts, and under worse case conditions a total peak to peak voltage excursion of 0.6 volts, with the possibility of only 0.1 volts of signals above and below the reference level, far less than the required drive levels for FET memory arrays. The present invention is directed to coupling low level, fast switching ECL voltage levels to FET memory address and data inputs.

One approach to the foregoing problem is described in *Electronics*, Sept. 9, 1985, at page 94. The article describes an ECL to CMOS interface which uses BIMOS, a mixture of CMOS and bipolar technology to manufacture a single memory chip. The multiple process steps of integrating bipolar and CMOS technologies is necessarily complex and expensive and thus undesirable.

Another example of a bipolar logic level to FET logic level interface circuit is described in *IBM Technical Bulletin*, Volume 19, No. 8, January 1977, pages 2953-2954. This circuit provides a clocked circuit for receiving input ECL or TTL logic levels. This circuit requires three timing signals to couple the logic signals on the input modes to higher voltages suitable for driving an FET array. No method for converting the timing signals from ECL levels to the required FET voltage levels is given.

SUMMARY OF THE INVENTION

It is an object of the invention to provide a circuit interface between bipolar ECL logic circuits and field effect transistor circuits.

It is a more specific object of the invention to provide interface circuits which can be driven with ECL voltage levels in a semiconductor memory.

These and other objects are provided by an interface circuit in accordance with the invention. The interface circuit includes a multiplier circuit which can provide a single ended FET logic level in response to a dual rail clock signal.

The interface circuit can be used to interface with the address or data inputs of an FET memory. The interface includes at least one sense amplifier having a reference input and logic level input connected to receive an ECL reference and logic level. The sense amplifier is clocked by the multiplier circuit to provide an FET logic level and the complement thereof.

In a preferred embodiment of the invention, the multiplier comprises an input field effect transistor having a source and gate connected to each clock signal rail. An amplification stage following the input field effect transistor provides a single ended output clocking signal.

The sense amplifier includes a clocked differential amplifier having a pair of input modes. The reference level and logic level to be converted are applied via separate gates to each input node. The clocking signal from the multiplier enables the gates and differential FET amplifier such that the amplifier assumes the state represented by the input logic level and reference level. The nodes are further connected by a pair of amplifier stages to output terminals forming the true and complement FET logic levels, suitable for driving an address or input line of an FET semiconductor memory.

DESCRIPTION OF THE FIGURES

FIG. 3A illustrates the sense amplifier of FIG. 1B in accordance with the preferred embodiment of the invention.

FIG. 3B demonstrates the gating circuit for connecting the mulfiplier circuit of FIG. 2B to the sense amplifiers.

DESCRIPTION OF THE PREFERRED EMBODIMENT

Figure 1A:
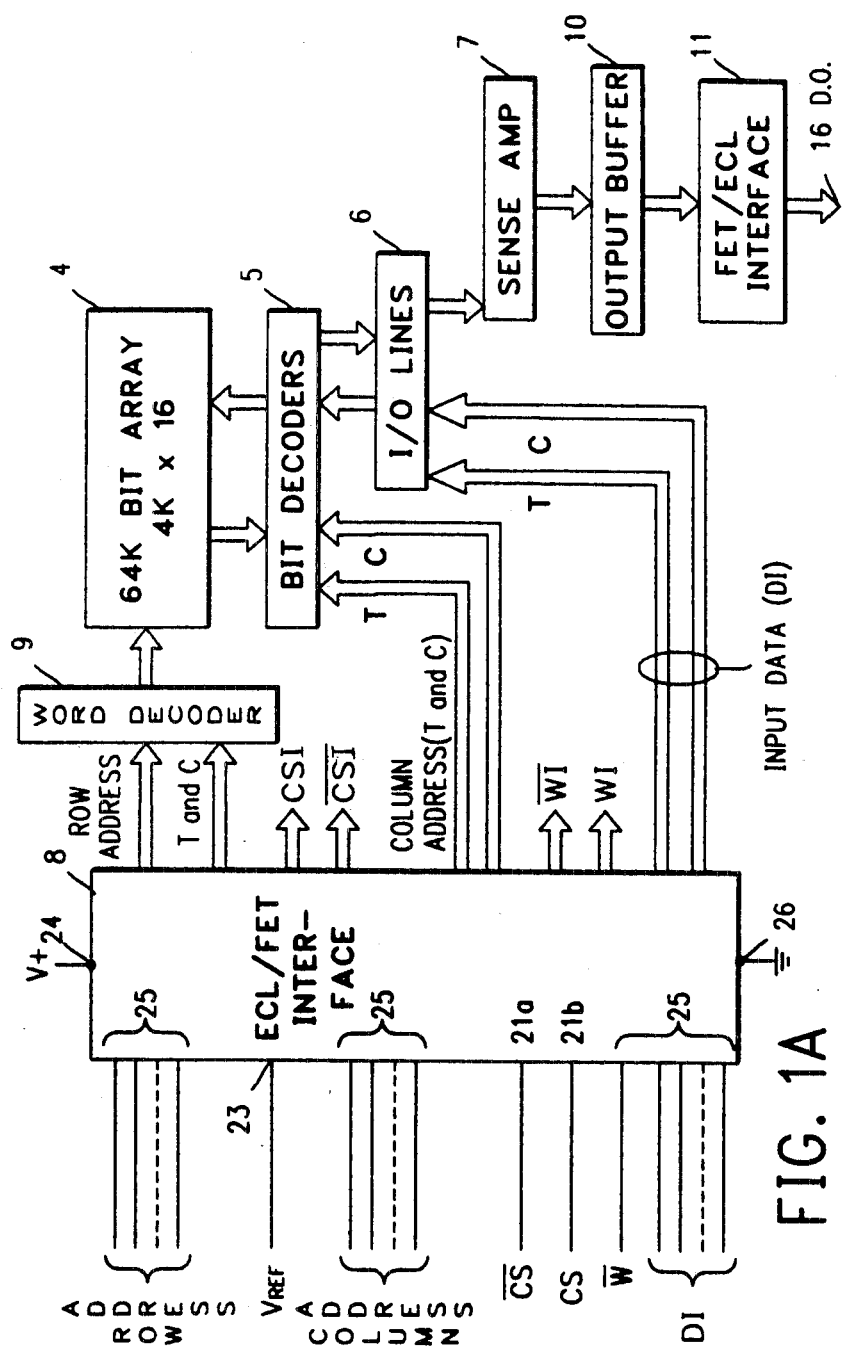
FIG. 1A illustrates a semiconductor memory having an ECL driven interface connected to the address and data input lines in accordance with one embodiment of the invention.

Referring now to FIG. 1A, there is shown a typical memory architecture for an FET CMOS random access memory. A 64k bit array 4 contains an array of FET transistors which can be addressed to write or read binary data. The memory shown is row and column addressable. The interface circuit shown as 8 may, of course, be used with other memory organizations.

The structure of FIG. 1A may be entirely fabricated in MOS semiconductor technology, but has the ability to interface with bipolar drive circuitry. In particular, bipolar ECL signal levels are directly interfaced with the memory structure of FIG. 1A.

The effective interface between ECL logic and field effect transistor FET logic levels is accomplished by the ECL/FET interface 8 and FET/ECL interface 11. The ECL/FET interface 8, the subject matter of the present invention, will convert all ECL logic levels to FET standard logic levels.

The ECL/FET interface is located on the same substrate as the remaining portion of the memory, thus facilitating an entirely MOS fabricated structure.

The off-chip ECL drive signals are received in the ECL/FET interface 8. These drive signals, which are usual for controlling a memory, include a write signal W, column address signals, row address signals and data input DI signals. The usual memory control inputs are received on pins which are generically referred to as 25. Each of these inputs is a single ended input with respect to ground for supplying an ECL logic level. The row address and column address in a row and column addressable memory as shown in FIG. 1A typically include respectively 7 and 5 signal inputs. The data input is typically 16 bits wide in memory organized according to FIG. 1A.

Additional to the single ended standard ECL logic signals used to control the memory, a dual rail clock signal, CS and $\overline{CS}$ are received on pins labelled 21a and 21b. The clock signal is the only signal applied via a dual rail input to the ECL/FET interface. A ground connection 26 and power supply Vc connection 24 are provided for the entire chip.

An additional signal received by the circuit of FIG. 1A on pin 23 is a VREF signal supplied by the ECL logic. The ECL logic states are centered with respect to VREF Thus, the ECL/FET interface includes only a single dual rail input, CS and $\overline{CS}$, and a VREF input, for a maximum of two additional pins required to interface the MOS structure of FIG. 1A with ECL drive logic. With these additional two pins and their associated signals, any number of single ended logic inputs may be interfaced to produce both true and complement (T and C) output logic levels.

The remaining portion of FIG. 1A shows the standard architecture for a row and column addressable memory. A 64k bit array 4 is shown comprising a semiconductor memory having a row address driven by word decoder 9, and by bit decoder 5 driven by the column addresses. Each of the converted ECL logic levels are applied by the interface 8 along with the input data signals. Thus, the memory of FIG. 1A is driven with FET logic levels.

The sense amplifier 7 and output buffer 10 receive stored data from the 64k bit array 4 and provide them to an FET/ECL interface 11. Thus, the data stored as FET logic levels in array 4 is provided as ECL logic levels on output lines 16. Thus, the entire memory of FIG. 1A is made input/output compatible with ECL logic levels.

The structure of the ECL interface 8 is designed to minimize the required pin out for connections to the memory. Only one dual rail input is necessary for interfacing with the ECL logic circuitry. This dual rail input receives the chip select signal and its complement, CS and $\overline{CS}$, from the ECL logic circuit connected to the ECL/FET interface. Additionally, a reference VREF is received from the ECL logic circuit on pin 23. The remaining pins of the ECL/FET interface may be connected to standard single end ECL logic levels used for generating addresses, write commands and data transfer from ECL logic circuitry.

Figure 1B:
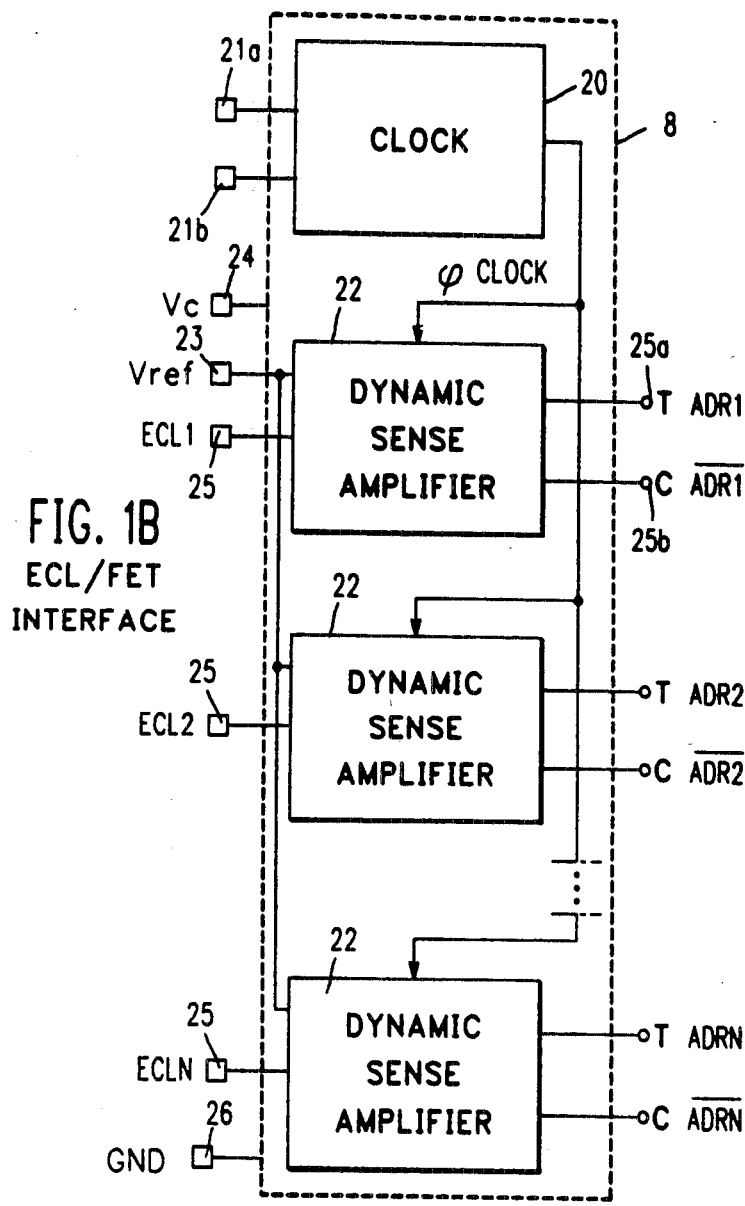
FIG. 1B is a block diagram illustrating the preferred ECL/FET interface for the ECL address and input signals of FIG. 1A.

Referring now to FIG. 1B, an example of the ECL/FET interface 8 of FIG. 1A is shown. The ECL interface 8 receives the dual rail chip enable signals on pins 21a and 21b. From the dual rail chip select signals, a clock signal $\phi$ for clocking in logic states appearing at the input of a plurality of dynamic sense amplifiers 22 is provided. Each dynamic sense amplifier 22 receives on an input thereof an ECL logic level which is to be converted to an FET semiconductor logic level. Additionally, the VREF signal from the ECL logic circuitry establishing a reference voltage for the dynamic sense amplifier is connected to each dynamic sense amplifier 22. With only the connection shown in FIG. 1B, it is possible by repeating the dynamic sense amplifier structure 22 to convert any number of single ended ECL logic inputs to a true and complementary FET logic level. As shown in FIG. 1B, ECL 1 applied to pin 25 provides both a true and complementary value, which can be one bit of an address and its complement. The circuit pin out overhead utilizing the ECL/FET interface of 1B, includes only a pin for the VREF input 23, and an additional pin for the complement of the chip enable signal, $\overline{CS}$ for a total of two additional pins necessary to provide an ECL-compatible MOS semiconductor random access memory.

Figure 2A:
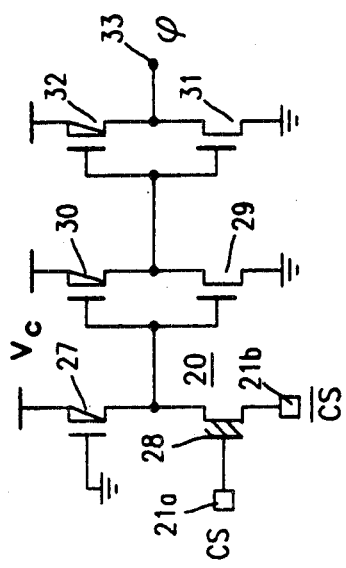
FIG. 2A is a schematic illustration of the dual rail input ECL portion of the clock circuit of FIG. 1B.

Referring now to FIG. 2A, there is shown the clock circuitry 20 for generating a clock signal $\phi$, used to clock each of the dynamic sense amplifiers 22 from the chip select signal CS and its complement, $\overline{CS}$. A first N channel depletion FET 28 receives on its gate connection the CS level and the $\overline{CS}$ logic level on its source connection. A P channel FET 27 serves as a load for the N channel transistor 28.

The N channel FETs 29 and 31 and P channel FETs 30 and 32 are connected to provide a signal amplifier for driving the clock input of dynamic sense amplifiers 22 of the ECL/FET interface. Terminal 33 of the clock generator 20 provide the required clock signal $\phi$ to each of the dynamic sense amplifiers 22.

Figure 2B:
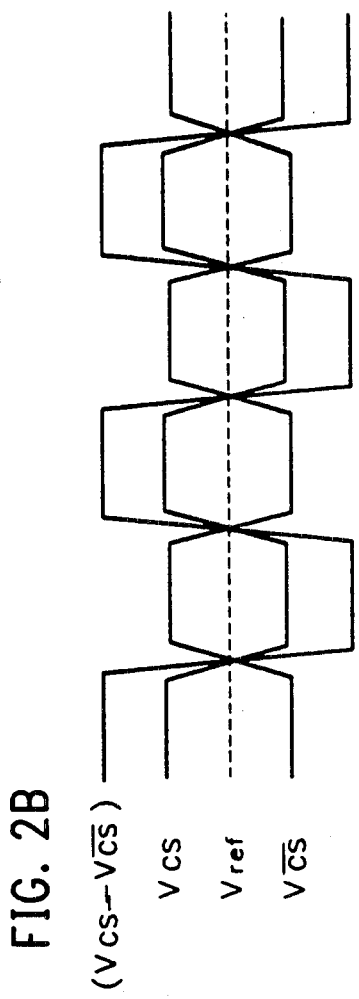
FIG. 2B illustrates the dual rail ECL logic levels V-CS and V-CS applied to the multiplier circuit of FIG. 2A and the difference between the dual rail ECL logic levels.

The circuit of FIG. 2A is effectively a multiplier, multiplying the logic level CS to substantially an FET logic level. Referring to FIG. 2B, there is shown the voltage levels representing the $\overline{CS}$ logic level, and CS logic level.

The voltage difference between these two signal levels, as shown in FIG. 2B, appears across the gate and source of the N channel depletion FET 28. The depletion implant of the channel of FET 28 is chosen so the threshold voltage is approximately equal to $VCS - V\overline{CS}$ where VCS is a low ECL signal level and $V\overline{CS}$ is a high ECL signal level. Since the nominal ECL levels are $\pm 0.5$ volts, this gives a depletion threshold of approximately $-1$ volt. For the case where VCS is low and $V\overline{CS}$ is high the gate-to-source voltage of FET 28 is 1 volt, which provides a drive voltage (gate-to-source minus threshold voltage) of 2 volts. It should be noted that the input ECL voltage levels of FIG. 2B can shift up or down around the reference voltage level due to power supply variations or noise and the input ECL signal voltage under these worst case conditions can be as small as 0.1 volts with regard to the reference voltage level which is smaller than the threshold variation of an FET device. However, by bringing in CS and $\overline{CS}$ dual rail and taking the difference between these ECL voltage levels, one is only concerned with differences in the amplitudes of the two ECL input voltage levels and not the difference between the amplitude and a reference level. Since the worst case peak to peak ECL voltage is 0.6 volts, the difference between the dual rail inputs CS and $\overline{CS}$ gives a 6× multiplication over the amount of signal that would be available if only a single rail ECL input signal were available. The multiplication effect of the dual rail input signal provides sufficient signal to be detected using FET devices. In addition, the dual rail signal results in higher speed operation than would be possible with single rail operation.

Having thus developed the clocking signal for the ECL/FET interface of FIG. 1B, each ECL logic level to be converted to an FET level may be procesed by the corresponding dynamic sense amplifier 22.

Referring now to FIGS. 3A and 3B, there is shown the required sense amplifier for generating from an input ECL logic level an FET logic level and its complement. FIG. 3B illustrates a circuit for providing the additional clock signals $\phi 1$ and $\phi 2$, in response to the clock signal $\phi$. FIG. 3B includes two P channel FETs 34 and 35, serially connected with corresponding N channel FETs 36 and 37, to provide delayed clock signals $\phi 1$ and $\phi 2$, where $\phi 2$ is the inverse of $\phi 1$, delayed by the connection of FET pair 38. $\phi 1$ is delayed a similar amount by the operation of FET pair 39 from $\phi$.

The resulting clock signals are applied to the sense amplifier of FIG. 3A to establish an FET logic level at outputs 25a and 25b. Each of the sense amplifiers represented by FIG. 3A includes a cross-coupled FET latch 41. The FET latch 41 is clocked by N channel FET 48, receiving on gate 42 a $\phi 1$ clock signal. Each side of the cross-coupled latch includes a P channel FET 44, 45, clocked by P channel FETs 67, 68 serially connected with N channel FETs 46, 47. The nodes 50 and 52 of latch 41, which are connected to the cross-coupled gates, may be switched to store a given input logic level. The cross-coupled latch 41 is connected via P channel FETs 67 and 68 to an FET operating potential received on pin 24. The ground connection for the FET voltage source is connected through pin 26.

The operation of the FET latch 41 is such that gate transistors 53 and 54, two N channel FETs receive the VREF voltage on pin 23 and ECL 1 logic level to be converted to an FET logic level on pin 25. Upon application of the clock signal $\phi$ to gates 54a and 53a of the corresponding input gate transistors 53 and 54, the logic level ECL 1 will be coupled to node 50 and the VREF potential to node 52. The dynamic sense amplifier of FIG. 3A is set by clock pulses $\phi$, $\phi 1$ and $\phi 2$. The initial part of the sensing operation commonly referred to as a slow sense, is initiated by clock $\phi$ falling and turning on P channel transistor 68. After clock $\phi$ falls, $\phi 1$ which is connected to N channel transistor 48 rises and clock $\phi 2$ which is connected to P channel transistor 67 falls. This is the fast sense part of the sense amplifier setting. The difference between the ECL signals ECL1 and VREF will determine the state that latch 41 of the dynamic sense amplifier will be set. Nodes 50 and 52 of latch 41 will set at FET voltage levels.

Thus, for each clock pulse $\phi$ received, the logic level ECL 1 will be gated to the node 50 and compared with VREF on node 52. The state of the latch 41 after setting represents the ECL logic state but at a voltage potential compatible with the FET transistor structure for the memory.

Each of the nodes 50 and 52 are connected to a respective amplifier chain comprising a plurality of P channel FETs, 55 through 60, serially connected with N channel FETs 61 through 66. Thus, the complement C of the ECL logic state received on pin 25 as well as the true value T of the logic state is available for driving the remaining circuitry of FIG. 1A in logic levels of the FET structure.

Thus, it can be seen that the ECL/FET interface of FIG. 1B can be implemented with standard MOS components requiring only two additional pins from normal MOS semiconductor memory devices. The additional pin being required to carry the complement of the chip enable signal, $\overline{CS}$, and a voltage reference level VREF for the device. Any number of logic levels to be converted from ECL to FET compatible logic levels may be generated with the ECL/FET interface of FIG. 1B without incurring additional pin-out overhead.

Thus, by combining the clock circuit 20 comprising a multiplier of FIG. 2A with the dynamic sense amplifier of FIG. 3A, the required interface can be achieved with only the foregoing additional pin-out overhead.

The following Table illustrates specific transistor structures which may be used in the implementation of the multiplier of FIG. 2A and the dynamic sense amplifier of FIGS. 3A and 3B. The Table below gives the width to length ratio of each of the transistors described.

| Transistor No. | Type | Width/Length Ratio |
|---|---|---|
| 27 | P | 5/1 |
| 28 | N depletion | 20/1 |
| 29 | N | 5/1 |
| 30 | P | 10/1 |
| 31 | N | 20/1 |
| 32 | P | 40/1 |
| 34 | P | 40/1 |
| 35 | P | 60/1 |
| 36 | N | 20/1 |
| 37 | N | 30/1 |
| 44 | P | 80/1 |
| 45 | P | 80/1 |
| 46 | N | 20/1 |
| 47 | N | 20/1 |
| 48 | N | 30/1 |
| 53 | N | 20/1 |
| 54 | N | 20/1 |
| 67 | P | 40/1 |
| 68 | P | 10/1 |

Transistors 55–60 and 61–66 represent amplification stages for coupling the nodes of latch 41 to an address true and complement drive. The transistors are selected to minimize loading on nodes 50, 52 while providing sufficient signal drive for large capacitance address inputs. Standard sense amplifier buffering techniques may be employed to carry out the required interface between nodes 50, 52 and address outputs 25b and 25a.

Thus, there has been described with respect to specific circuit details an ECL/FET interface described more particularly by the claims which follow.

What is claimed is:

1. An interface circuit for driving an FET logic circuit from a bipolar transistor logic circuit comprising:
   dual rail input terminals for receiving complementary clocking logic levels from said bipolar transistor logic circuit;
   a small signal multiplier having an output and comprising an FET amplifier having an input FET transistor connected through its source and gate to said dual rail input terminals producing an FET logic level in response to said complementary clocking logic levels; and
   an FET dynamic sense amplifier having a first input connected to a reference voltage level provided by said bipolar transistor logic circuit, Vref, a second input connected to a logic output connection of said bipolar transistor logic circuit, ECL1 and a clocking input connected to said small signal multiplier output, said dynamic sense amplifier providing complementary FET logic levels which are determined by the difference of voltage potential between said first and second inputs of Vref and ECL1, respectively.

2. The interface circuit of claim 1 wherein said multiplier circuit input FET transistor has a dopant level which provides conduction threshold at substantially the voltage represented by the difference between said gate and source connections for one logic state on said dual rail input terminals.

3. The interface circuit of claim 1 wherein said sense amplifier includes
- a clocked differential latch having first and second input nodes and a clock input, said latch input nodes assuming states proportional to the difference between input node potentials when a clocking signal is received;
- first and second gate means, said first gate means connecting Vref to one of said nodes and said second gate means connecting ECL1 to the other of said nodes;
- means for enabling said first and second gate means in synchronism with said clocking signal, whereby said latch assumes a state proportional to the difference between said first and second input voltages; and,
- first and second inverter circuits connected to said nodes whereby first and second complementary outputs are provided representing logic levels at said nodes.

4. The interface circuit of claim 1 wherein said signal multiplier comprises:
- an input FET transistor of a first conductivity type having a source and gate connected to said rails, and a load FET transistor having a source and drain connected in series with said input transistor source and drain, and a gate connected to a common voltage connection;
- an amplifier stage including second and third FET transistors having gate connections connected to the junction of said serial connection of said input FET transistor and load transistor and having source and drain connections serially connected to form an output connection; and
- means for applying a DC voltage across said load transistor gate and drain connection and said amplifier serially connected transistors, whereby complementary input signals applied to said input FET transistor gate and source produce a single logic state at said output connection.

* * * * *

UNITED STATES PATENT AND TRADEMARK OFFICE
CERTIFICATE OF CORRECTION

PATENT NO. : 4,645,954

DATED : February 24, 1987

INVENTOR(S) : Schuster

It is certified that error appears in the above-identified patent and that said Letters Patent is hereby corrected as shown below:

In column 2, line 41, should read:

"V-CS and V-$\overline{CS}$ applied to the multiplier circuit of FIG."

on line 48, correct the spelling of "multiplier".

Signed and Sealed this

Fifteenth Day of December, 1987

*Attest:*

DONALD J. QUIGG

*Attesting Officer*  *Commissioner of Patents and Trademarks*